United States Patent
Kohama et al.

(10) Patent No.: US 6,926,794 B2
(45) Date of Patent: Aug. 9, 2005

(54) INFORMATION CARRIER AND PROCESS FOR PRODUCTION THEREOF

(75) Inventors: Kyouichi Kohama, Toride (JP); Ryuzo Fukao, Ibaraki-ken (JP); Wasao Takasugi, Higashiyamato (JP); Kazuhiko Daido, Toride (JP); Toshinobu Sueyoshi, Kyoto-fu (JP)

(73) Assignee: Hitachi Maxell, Ltd., Ibaraki (JP)

( * ) Notice: Subject to any disclaimer, the term of this patent is extended or adjusted under 35 U.S.C. 154(b) by 269 days.

(21) Appl. No.: 10/270,001

(22) Filed: Oct. 15, 2002

(65) Prior Publication Data

US 2003/0037875 A1 Feb. 27, 2003

Related U.S. Application Data

(63) Continuation of application No. 08/814,921, filed on Mar. 12, 1997, now Pat. No. 6,482,495.

(30) Foreign Application Priority Data

Sep. 4, 1996 (JP) .............................................. 8-234399
Feb. 6, 1997 (JP) .............................................. 9-023775

(51) Int. Cl.$^7$ .............................................. G06K 19/06
(52) U.S. Cl. ................... 156/308.2; 156/309.6
(58) Field of Search .......................... 156/308.2, 309.6; 257/679; 235/488, 492; 428/74, 138

(56) References Cited

U.S. PATENT DOCUMENTS

| 4,294,643 A | 10/1981 | Tadewald |
| 4,617,216 A | 10/1986 | Haghiri-Tehrani et al. |
| 5,585,618 A | 12/1996 | Droz |
| 5,856,662 A | 1/1999 | Kohama et al. |

*Primary Examiner*—John T. Haran
(74) *Attorney, Agent, or Firm*—Birch, Stewart, Kolasch & Birch LLP

(57) ABSTRACT

The present invention provides an information carrier which has flat surfaces, is excellent in beautiful appearance and permits beautiful necessary printing, and a production process which permits easy and inexpensive production of such an information carrier. An IC chip 1 and a coil 2 connected to the IC chip are embedded in a substrate 3 composed of a nonwoven fabric. The IC chip and the coil are held between two nonwoven fabrics produced according to a conventional production procedure. The laminate of the nonwoven fabrics is fed to a roller or a press and the two nonwoven fabrics are hot-pressed, whereby their mating surfaces are joined with or without an adhesive (including low-melting synthetic resin fiber) incorporated into the webs. After positioning of the coil in the thus obtained raw product of information carrier, the laminate of the nonwoven fabrics and cover sheets is cut to obtain an information carrier of predetermined shape and size.

6 Claims, 15 Drawing Sheets

Prior Art

Prior Art

INFORMATION CARRIER AND PROCESS FOR PRODUCTION THEREOF

This application is a continuation of application Ser. No. 08/814,921, filed on Mar. 12, 1997, now U.S. Pat. No. 6,482,495, the entire contents of which are hereby incorporated by reference.

BACKGROUND OF THE INVENTION

The present invention relates to an information carrier obtained by supporting on a substrate at least one fitting for, for example, storing, displaying or processing information, and a process for producing the same. In particular, it relates to a non-contact type information carrier obtained by the use of an IC chip and a coil and a process for producing the same.

Various information carriers have been proposed which are obtained by supporting on a substrate an IC chip and a part for supplying a power source and/or transmitting information signals, store information, and give information to a reader•writer or receive information therefrom. Such information carriers are used for, for example, storing personal information on deposits, insurances, commutation tickets, licences, health, identification, etc., information on product management in factories, and information on commodity management in the commodity distribution field, or the employment of the information carriers for such purposes is investigated.

FIG. 20 and FIG. 21 are diagrams showing an example of such an information carrier which has been known: FIG. 20 is a partially sectioned plan view of the information carrier, and FIG. 21 a sectional view taken along the line II—II of FIG. 20. In these drawings, the symbol 100 shows an IC chip; the symbol 101 a coil connected to the IC chip 100; the symbol 102 a substrate supporting the IC chip 100 and the coil 101; the symbol 103 a resin constituting the substrate 102; the symbol 104 a reinforcer for the resin 103; and the symbols 105 and 106 cover sheets attached to the right side and reverse side, respectively, of the substrate 102 through bonding layers 110, respectively.

As is clear from these drawings, in this example of the information carrier, the IC chip 100 and the coil 101 are placed in a cut-out hole 104a made in the reinforcer 104, and the space in the cut-out hole 104a is filled with the resin 103, which is infiltrated into the reinforcer 104, whereby the substrate 102 is formed. Since this example of the information carrier thus comprises the reinforcer 104 having the cut-out hole 104a, and the IC chip 100 and coil 101 placed in the cut-out hole 104a, a position in the substrate 102 at which the coil 101 is set can be accurately controlled by adjusting the size of the cut-out hole 104a to a suitable size for the coil 101, so that the efficient receipt of electric power from an external equipment and the efficient transmission of signals from or to the external equipment are possible.

The above well-known example of the information carrier, however, involves the following problem: since the IC chip 100 and the coil 101 are placed in the cut-out hole 104a made in the reinforcer 104 and the resin 103 inside and outside the cut-out hole 104a is cured, the strength inside the cut-out hole 104a having no reinforcer 104 is low, so that when the information carrier receives an irregular external force such as flexure, stress is concentrated within the cut-out hole 104a, resulting in easy cracking of the substrate 102.

Said information carrier also involves the following problem: after accurately setting the IC chip 100 and the coil 101 in the reinforcer 104 having the required cut-out hole 104a, filling of the cut-out hole 104a with the resin, impregnation of the reinforcer 104 with the resin, and curing of the resin have to be carried out, so that a complicated production process is required, resulting in difficult production of an inexpensive information carrier. Particularly when various information carriers are produced on the same production line, reinforcers 104 different in the size of the cut-out hole 104a have to be prepared depending on the sizes of the IC chip 100 and the coil 101 which are to be placed in the cut-out hole 104a, so that a more complicated production process is required, resulting in a high production cost of the information carriers.

In addition, in the above well-known example of the information carrier, the reinforcer 104 is made of, for example, woven fabric obtained by plain weave of glass fiber, so that when the cut-out hole 104a is made by cutting the reinforcer 104, glass fibers are frayed and stuck out of the cut surface to cause the following phenomenon: as shown in FIG. 22, the frayed glass fibers 107 jut out inside the cut-out hole 104a or extend above or below the reinforcer 104.

When the frayed glass fibers 107 thus jut out inside the cut-out hole 104a, the following disadvantage is brought about: as shown in FIG. 23, which is a sectioned plan view taken along the line C—C of FIG. 22, the thickness of a portion where the IC chip 100 and/or the coil 101 overlaps with the glass fibers 107 exceeds the thickness of the substrate 102, so that the surface flatness of the substrate 102 and hence that of the cover sheets 105 and 106 are deteriorated. When the frayed glass fibers 107 extend above or below the reinforcer 104, the thickness of such a portion is larger than that of the other portion of the substrate 102, so that the flatness of the cover sheets 105 and 106 is deteriorated. When the flatness of the cover sheets 105 and 106 is deteriorated, the beautiful appearance and the ease of handling are deteriorated, resulting in a decreased commercial value. Furthermore, when the information carrier is such that, for example, a photograph of owner's face is printed on the surface of the cover sheet 105 or 106 after the production of the information carrier, the information carrier is disadvantageous in that the photograph of the face cannot be clearly printed.

Since the woven fabric obtained by plain weave of glass fiber is hardly compressible in the direction of the thickness, pressing of the substrate 102 cannot remove the thickness nonuniformity of the substrate 102 and moreover tends to destroy the IC chip 100 and the coil 101. The above-mentioned disadvantage can be removed by stopping the fraying, for example, by hardening and fixing the glass fibers 107 frayed and stuck out of the cut surface with a resin before inserting the IC chip 100 and the coil 101 into the cut-out hole 104a, but a production process of the information carrier becomes complicated as much, resulting in an increased production cost of the information carrier. Therefore, this method is not preferable.

In addition, since the above well-known example of the information carrier has a structure in which the cover sheets 105 and 106 are attached to the right side and reverse side, respectively, of the substrate 102 through the bonding layers 110, respectively, it is difficult to produce an information carrier with a good surface condition in high yield, so that the information carrier tends to cost a great deal. Moreover, since the bonding layer of about 0.1 mm thickness is necessary on each side, it is difficult to thin the information carrier. Depending on a material for the substrate 102 and a material for the cover sheets 105 and 106, the following problem is also caused: no high bond strength can be attained, so that the cover sheets 105 and 106 are peeled from the substrate 102 during use or shaping of the information carrier. For example, when a poly(ethylene terephthalate) (hereinafter abbreviated as "PET") is used as the cover sheets 105 and 106, peeling tends to be caused between the bonding layer 110 and each of the cover sheets 105 and 106, resulting in an insufficient utility of the information carrier.

Moreover, in the above well-known example of the information carrier, polyvinyl chloride, which is good in printing property and adhesion property, is typically used as the cover sheets 105 and 106. When polyvinyl chloride is burnt, chlorine gas is generated. Thus, the information carrier using polyvinyl chloride may deteriorate earth environment. Therefore, it is intensively desired to develop an information carrier free of such an environmental problem. If PET or PEN, which does not generate chlorine gas when burnt, is used as the cover sheets 105 and 106, an information carrier free of the environmental problem can be obtained. However, PET and PEN are poor in adhesion property as described above so that PET or PEN per se cannot be used as the cover sheets. Furthermore, PET and PEN are poor in printing property. Thus, it is difficult to print beautiful images on an information carrier comprising cover sheets 105 and 106 composed of PET or PEN.

SUMMARY OF THE INVENTION

The present invention was made for solving such problems and objects thereof are to provide an information carrier which can easily be produced, is excellent in durability and beautiful appearance, and permits beautiful necessary printing; and a production process which permits easy and inexpensive production of such an information carrier.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

Figure 1:
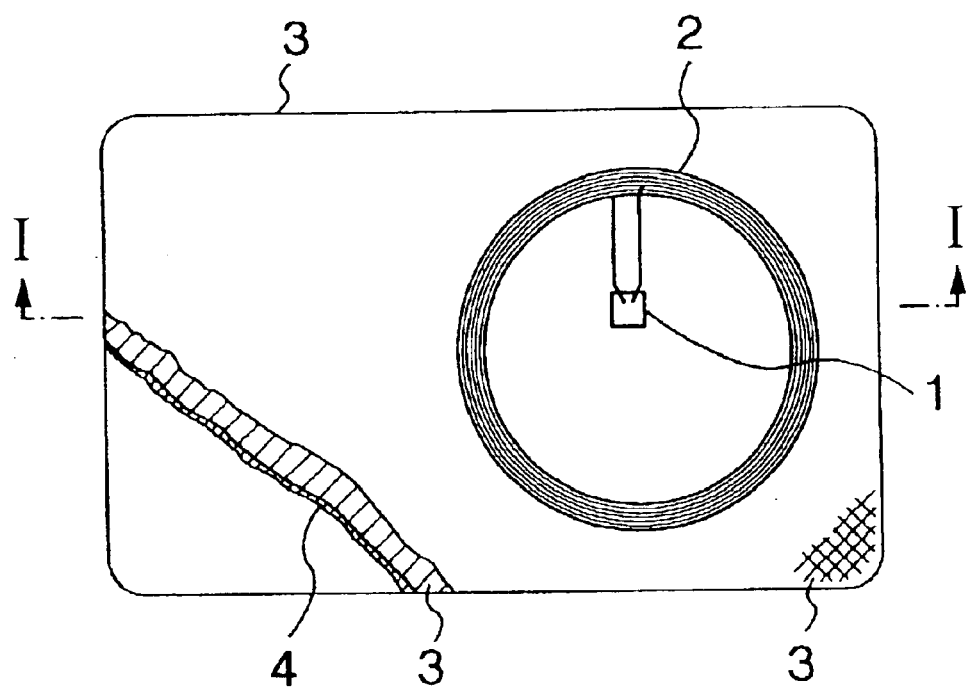
FIG. 1 is a partially sectioned plan view of an information carrier according to a first embodiment.

In the above drawings, the numerals denote the followings:

1: IC chip,
2: coil,
3: substrate,
4: top cover sheet,
5: bottom cover sheet,
11: coil for positioning,
12: transmission efficiency measuring device,
13: cutter,
21: magnetism-positioning means,
31: external equipment,
32: coil,
33: carrier-positioning means,
41: circuit pattern,
42: nonwoven fabric,
51: surface plate,
52: press plate,
61, 62: sheet-like member.

DETAILED DESCRIPTION OF THE INVENTION

For solving the above-mentioned problems, the present invention employs the following structure of an information carrier: in an information carrier comprising a substrate of necessary shape and size, a synthetic resin-made cover sheet provided on the surface of said substrate and a fitting supported on the substrate, the substrate is composed of a compression body or deformation body of a facial material having compressibility or deformability in the direction of the thickness, the substrate and the sheet cover are united in an inseparable body using part of the substrate material and the cover sheet material, the cover sheet is united in a body to the surface of the substrate using part of the resin material composing the substrate, and the fitting is embedded in an indent formed by partly compressing or deforming the substrate.

As the facial material composing the substrate, there can be used a woven fabric, knitted fabric or nonwoven fabric which is thermocompression-bondable as itself, or there can be used a woven fabric, knitted fabric, nonwoven fabric, paper or skin provided with curability after the compression by impregnating a synthetic resin. Further, there can be used a synthetic resin sheet made capable of being deformed in the thickness direction and of being compression bonded with other materials by chemical treatment such as solvent treatment and by physical treatment such as heat treatment.

As the woven fabric, knitted fabric or nonwoven fabric having thermocompression-bondability as itself, there can be used one using as stock fiber so-called conjugate fiber wherein each monofilament consists of two or more portions different in melting point, one composed of a mixed yarn fabric or mixture of two or more synthetic fibers different in melting point, and one obtained, using as stock fibers glass fiber, carbon fiber, Kevlar fiber, chemical fiber, natural fiber and a combination thereof, by bonding between the stock fibers with a resin binder. On the other hand, as a woven fabric, knitted fabric, nonwoven fabric or paper provided with post-compression curability by impregnating a synthetic resin, there can be used one employing as stock fiber glass fiber, carbon fiber, Kevlar fiber, chemical fiber, natural fiber or a combination thereof. As the nonwoven fiber there can be used ones of all the structures belonging to the well-known. As the well-known nonwoven fabric, there can be used, for example, one having webs constructed with random fibers obtained by fibrillation of melt-spun synthetic resin filaments, one having webs made of synthetic resin fiber having a fine network structure formed by jetting of a solution of a starting polymer, and the like.

In performing printing, for example, design printing on the information carrier, the printing can be done directly on the surface of the cover sheet, or alternatively necessary printing is provided on the substrate serving as a foundation of the cover sheet so as to enable to see the printing with eyes from the outside through the cover sheet. By this, even when PET or PEN resin poor in printing property is used as the cover sheet, a beautiful design printing can be provided easily and durably on the information carrier.

As a casing material of the information carrier, especially as materials for the substrate and cover sheet, from the point of protecting earth environment, it is desirable to use materials not emitting toxic substances of chlorine gas and others when they are burnt. From this standpoint, it is desirable to form the synthetic resin portion of the substrate and the cover sheet with PET or PEN resin. In this case, to facilitate casing of information carrier, as a synthetic resin material constructing the synthetic resin portion of the substrate, there can be used PET or PEN resin having a low melting point, and as the cover sheet there can be used PET or PEN resin film having a high melting point.

In performing printing, for example, design printing on the information carrier, the printing can be done directly on the surface of the cover sheet, or alternatively necessary printing is provided on the substrate forming the base of the cover sheet to enable to see the contents of the printing with eyes from the outside through the cover sheet. By this, even when PET or PEN resin poor in printing property is used as the cover sheet, a beautiful design printing can be provided easily and durably on the information carrier. Further, when PET or PEN resin film is used as the cover sheet material, to improve adhesion with the substrate, it is preferable to form fine unevenness on the side of the adhesion surface of PET or PEN resin film. Further, when direct printing is provided on the surface of PET or PEN resin film, to improve printing property, it is desirable to form fine unevenness on the surface. When fine unevenness is formed on the both sides of PET or PEN resin film, it is desirable to make the coarse surface to improve adhesion coarser than that to improve printability for each function to be exhibited effectively.

As the fitting(s) supported on the substrate, there can be used, as deemed necessary, either at least one part selected from the group consisting of IC chips, IC modules, means for non-contact transmission of data and/or a power source, electrodes terminals for transmission of data and/or a power source, capacitors, resistors, solar cells, liquid crystal display devices, image displayers, optical recording media, magneto-optical recording media and magnets or ferromagnetics for locating the information carrier at the carrier-setting position of reader/writer with high precision; or a combination of any of these parts and other parts. These fittings can be embedded in the middle in the thickness direction of the substrate to form the obverse and the reverse of the substrate in a plane, or these fittings can be embedded in an indent formed on one side of the substrate to form the obverse including the obverse of the embedded fittings and the reverse of the substrate in a plane.

Mounting the fitting(s) on the substrate can be carried out by directly forming a circuit pattern on the fitting mounting surface of the substrate and by electrically connecting the circuit pattern and the input-output terminals of an electronic appliance, i.e., the fitting. In this case, it is possible to form on part of the circuit pattern a coil as a means for non-contact transmission of data and/or a power source.

Thus, when necessary fitting(s) is embedded in the substrate constituted by a compression body or deformation body of a facial material having compressibility or deformation property in the direction of the thickness, since it is not necessary to open a cut-out hole in the substrate, stress is not concentrated on part of the substrate which stress is caused when the substrate receives an irregular external force such as flexure, and strength and durability of the information carrier are enhanced. Further, a cut-out hole is not made in the substrate, such phenomena does not occur that glass fibers frayed out from the cut-out surface overlap with the fitting or extend above or below the substrate. Accordingly, the right and reverse sides of the substrate can be formed flat, so that the appearance of the information carrier can be made beautiful, and that when the information carrier is such that, for example, a photograph of owner's face is printed on the surface of the substrate or the surface of a cover sheet attached to the surface of the substrate, the photograph of the face or the like can be clearly printed.

Meanwhile, methods for manufacturing the information carrier can take the methods mentioned in the following, depending on the structure of the information carrier.

<1> An information carrier having a predetermined shape and dimension is obtained through a step of overlapping on a first cover sheet a first facial material having compressibility or deformation property in the direction of the thickness; a step of mounting necessary fitting(s) on the first facial material; a step of overlapping on the first facial material mounted with the fitting a second facial material same or different from the first one and having compressibility or deformation property in the direction of the thickness; a step of overlapping a second cover sheet on the second facial material; a step of uniting each constituting material in a body by applying a thickness-wise compression force to these laminations and at the same time embedding the fitting in a compression body or deformation body of the first and second facial materials; and a step of cutting the lamination body.

<1a> A method for manufacturing a contact-less information recording carrier comprising the steps of:
- overlapping, on a first cover sheet, a first material which comprises synthetic resin fiber and has a low melting point portion and a high melting point portion,
- mounting, on the first material, an IC chip and a coil electrically connected to the IC chip, the coil being means for contact-less transmitting data and/or electric power,
- overlapping, on the first material on which the IC chip and the coil have been mounted, a second material which comprises synthetic resin fiber and has a low melting point portion and a high melting point portion,
- overlapping a second cover sheet on the second material to obtain a lamination, and
- applying a thickness-wise compression force under heat to the lamination.

<2> An information carrier having a predetermined shape and dimension is obtained through a step of overlapping on a first cover sheet a first facial material having compressibility or deformation property in the direction of the thickness; a step of mounting necessary fitting(s) on the facial material; a step of overlapping a second cover sheet on the facial material mounted with the fitting; a step of integrating each constituting material by applying a thickness-wise compression force and at the same time embedding the fitting in a compression body or deformation body of the facial material; and a step of cutting the lamination body.

<3> An information carrier having a predetermined shape and dimension is obtained through steps comprising a step of coating a melt of a cover sheet material on the one side of a facial material having compressibility or deformation property in the direction of the thickness and manufacturing, after cooling, a sheet-like material wherein the facial material and the cover sheet are united in an inseparable body; a step of mounting the fitting on the surface having compressibility or deformation property of the sheet-like material; a step of overlapping another sheet-like material of the same kind as the above-mentioned on the fitting mounted surface of the sheet-like material, with the surface of the sheet-like material having compressibility or deformation property being turn downward; a step of uniting each constituting material in a body by applying a thickness-wise compression force to these laminations and at the same time embedding the fitting in a compression body or deformation body of the facial material; and a step of cutting the lamination body.

<4> An information carrier having a predetermined shape and dimension is obtained through steps comprising a step of coating a melt of a cover sheet material on the one side of a facial material having compressibility or deformation property in the direction of the thickness and manufacturing, after cooling, a sheet-like material wherein the facial material and the cover sheet are united in an inseparable body; a step of mounting the fitting on the surface having compressibility or deformation property of the sheet-like material; a step of overlapping the cover sheet on the sheet-like material mounted with the fitting; a step of uniting each constituting material in a body by applying a thickness-wise compression force to these laminations and at the same time embedding the fitting in a compression body or deformation body of the facial material; and a step of cutting the lamination body.

In the above-mentioned manufacturing methods <1>–<4>, as the facial material constituting the substrate, there can be used a woven fabric, knitted fabric or non-woven fabric thermocompression-bondable as itself, or there can be used a woven fabric, knitted fabric, non-woven fabric, paper or skin provided with post-compression curability by impregnating a synthetic resin. Further, there can be used a synthetic resin sheet provided with thickness-wise deformation property and compression bondability with other materials by chemical or physical treatment.

When any of these production processes is employed, a cut-out hole need not be made in the substrate, so that the fixing of fibers frayed and stuck out of the cut surface of a cut-out hole is not necessary. Therefore, the production of the information carrier is simplified, resulting in a reduced production cost of the information carrier. Particularly when various information carriers different in the kind and size of fitting(s) are produced, it is not necessary to prepare different facial materials, depending on the kind and size of the fitting(s). Therefore, the productivity of the various information carriers is greatly improved, so that their production cost can be markedly reduced.

The facial material making a base for the substrate is pressed in the direction of the thickness after the fitting is mounted. Since these facial material are rich in compressibility and deformation property in the thickness direction, even when pressed thickness-wise after the mounting of the fitting, the fitting does not receive an excessive external force. Because of the excellent compressibility or deformation property in the direction of the thickness, when the facial material having the fitting mounted thereon is pressed in the direction of the thickness, the setting portion of the fitting gives rise to large compression or deformation, while other portions small compression or deformation. Therefore, the fitting can be embedded in the substrate even if a through-hole or a hollow is not formed in advance in the facial material, and the surfaces of the substrate can be made flat.

Further, since the substrate and the cover sheet of the information carrier are adhered without adhesive layer, it is possible to make the information carrier thinner and lower in cost compared with the case wherein these materials are adhered through adhesive layer.

In the production method <3> and <4>, by coating a melt of the cover sheet material on the one side of the facial material, the cover sheet is formed on the surface of the facial material, being united therewith in a body. Besides, the cover sheet can be formed in two layers by overlapping another synthetic resin film on the surface of the cover sheet.

In the production method <3> and <4>, since a melt of the cover sheet material is coated on the one side of the facial material, part of the cover sheet material penetrates into the surface of woven fabric and the like of the facial material to which the cover sheet is attached, and the facial material and the cover sheet are adhered more strongly compared with the case of the production method <1> and <2>. Accordingly, even when an insufficiently adhesive material such as PET or PEN is used as the woven fabric or cover sheet, peeling between the substrate and cover sheet is prevented, resulting in an improved durability of the information carrier.

Regarding the information carrier having IC chip and a coil embedded in the substrate as the fitting, in obtaining an information carrier of a predetermined shape and size by cutting the lamination body of the substrate and cover sheet, there can be employed the following method for positioning of the coil embedded in the lamination: the lamination having the IC chip and coil embedded therein is introduced into a cutter equipped with a coil for positioning which transmits a power source and/or information signals to the coil and a transmission efficiency measuring device for measuring the transmission efficiency of the power source and/or information signals between the two coils, and the transmission efficiency of the power source and/or information signals between the two coils is measured by means of the transmission efficiency measuring device, after which the lamination is fixed at a position at which the transmission efficiency is maximum, and a predetermined portion of the lamination is cut out with the cutter.

According to this method, it is possible to control the positioning of the coil on the substrate accurately. Thus, there can be obtained a non-contact type information carrier excellent in transmission efficiency of electric power and/or information signal.

DESCRIPTION OF THE PREFERRED EMBODIMENTS

Figure 2:
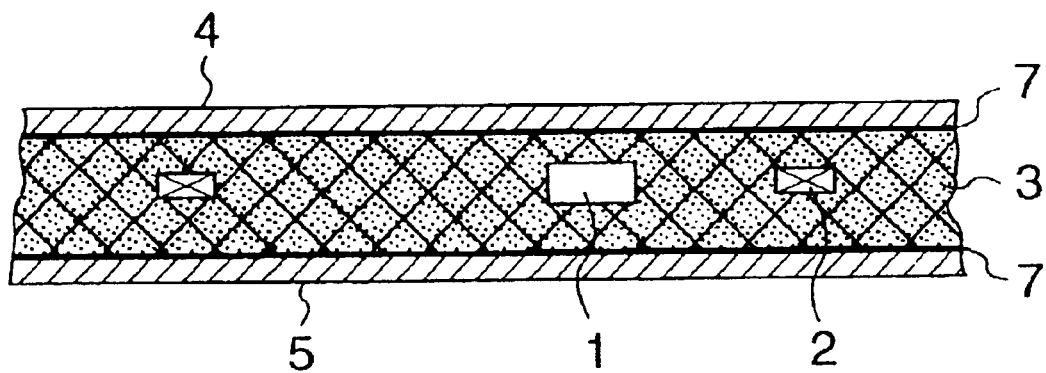
FIG. 2 is an enlarged cross-sectional view taken along the line I—I of FIG. 1.
Figure 3:
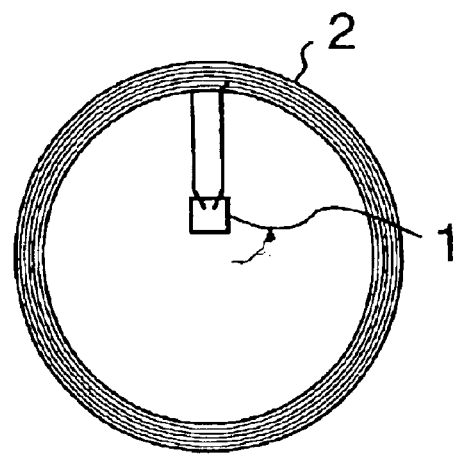
FIG. 3 is a plan view showing a first example of combination of an IC chip and a coil which are applied to the information carrier according to the first embodiment.
Figure 4:
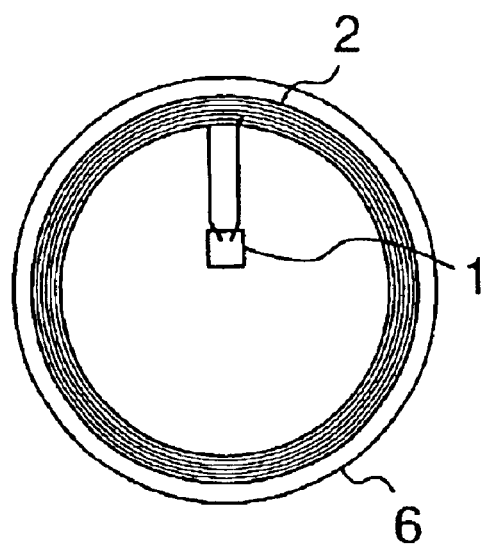
FIG. 4 is a plan view showing a second example of combination of an IC chip and a coil which are applied to the information carrier according to the first embodiment.

A first example of the information carrier of the present invention is explained below with reference to FIG. 1 to FIG. 6. FIG. 1 is a partially sectioned plan view of this example of the information carrier. FIG. 2 is an enlarged cross-sectional view taken along the line A—A of FIG. 1. FIG. 3 is a plan view showing a first example of combination of IC chip and coil used in this example of the information carrier. FIG. 4 is a plan view showing a second example of combination of IC chip and coil used in this example of the information carrier.

As is clear from FIG. 1 and FIG. 2, this example of the information carrier has the following structure: in a substrate 3 composed of a nonwoven fabric, there are embedded an IC chip 1 and a coil 2 which is connected to the IC chip 1 and serves in non-contact supply of a power source to the IC chip 1 by a reader•writer (not shown) and non-contact transmission of information signals between the information carrier and the reader•writer, and a top cover sheet 4 and a bottom cover sheet 5 are attached to the right side and reverse side, respectively, of the substrate 3.

The IC chip 1 and the coil 2 can be used without mounting them on a base plate, as shown in FIG. 3, or they can be used after being mounted and fixed on a base plate 6 as shown in FIG. 4. As the base plate 6 there can be used those formed of any of a metal plate, synthetic resin plate, nonwoven fabric, paper, leather, woven or knitted fabric of fiber, etc.

As the nonwoven fabric which constitutes the aforesaid substrate 3, all conventional nonwoven fabrics may be used. There may be used either nonwoven fabrics obtained from a web made of manufactured short fibers of, for example, glass fiber, carbon fiber, Kevlar fiber, chemical fiber, natural fiber or a combination thereof; or nonwoven fabrics obtained by direct fiber spinning out of a material for fiber, for example, nonwoven fabrics obtained from a web made of random fibers obtained by fibrillation of melt-spun synthetic resin filaments, and nonwoven fabrics obtained from a web made of synthetic resin fiber having a fine network structure formed by jetting of a solution of a starting polymer. As a process for producing the nonwoven fabric obtained from a web made of such synthetic resin fiber, there are spun bond process, melt blow process, flash spinning process, etc. As a method for joining webs produced, there are thermal bond method, latex bond method, etc. When the nonwoven fabric obtained from a web made of the synthetic resin fiber is used, there may be used one which is obtained from a web made of a mixture of high-melting synthetic resin fiber and low-melting synthetic resin fiber, in order to facilitate the joining of fibers.

Among these nonwoven, those which contain a synthetic fiber having a low melting point and can be heat-pressed by themselves may be used as materials for the substrate 3. In contrast, those which do not contain any synthetic fiber having a low melting point may be used as materials for the substrate 3 by impregnating a low melting point resin into the non-wovens to impart ability to be heat-pressed.

Figure 5:
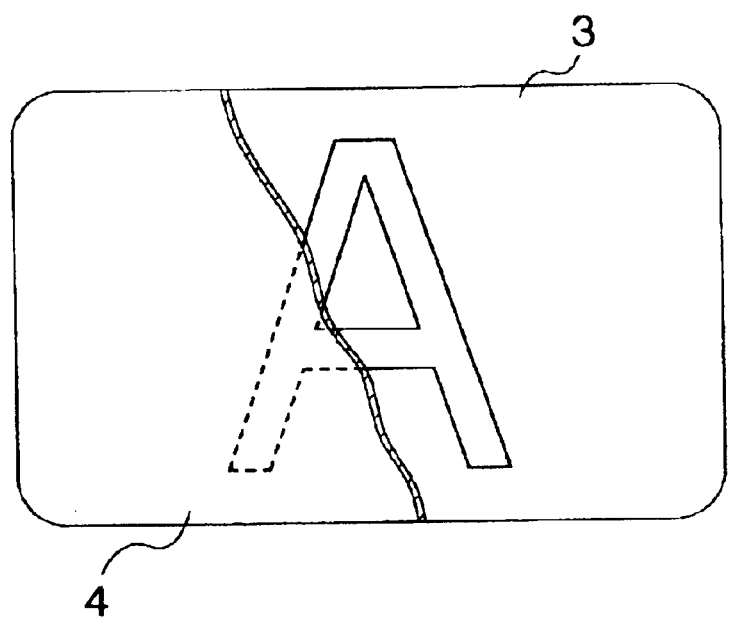
FIG. 5 is a partially sectioned view showing a structure of a printed surface of the information carrier according to the first embodiment.

The top cover sheet 4 is formed so as to have substantially the same shape and size as those of the said substrate 3 by using a resin material such as PET and PEN, and on its surface, the trade name, maker name and other logos of the information carrier are printed. If necessary, image information such as a photograph of the face of a card owner is printed on the surface of the cover sheet 4. The bottom cover sheet 5 is similarly formed so as to have substantially the same shape and size as those of the substrate 3 by using a resin material such as PET or PEN, and on its surface, precautions necessary in handling the information carrier, arrangements with a publisher, etc. are indicated. As methods for providing necessary indication on the surface of each cover sheet 4 and 5, printing is directly provided on the surface of the cover sheet 4 or 5, or, as shown in FIG. 5, necessary printing is provided on the obverse and reverse of the substrate 3 to enable to see these indications with eyes through the transparent cover sheets 4,5 from the outside. Further, it is possible to enable to see the printed indication from the outside with eyes by providing printing on the reverses of the cover sheets 4 and 5 and bonding the printed surface to the substrate 3. Since this prevents the printed contents from peeling off by abrasion, even when PET and PEN which are poorer in printing property than polyvinyl chloride and the like are used as the cover sheet, practically no problem arises.

Figure 6:
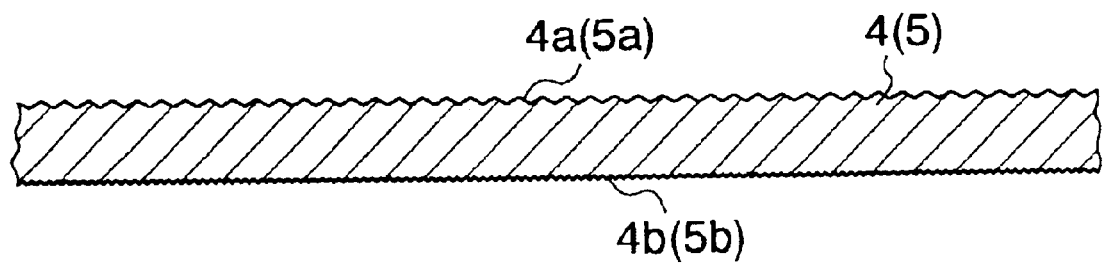
FIG. 6 is a partially sectioned view of a cover sheet.

On the reverses of the cover sheets 4 and 5 preferably formed is fine unevenness, as shown in FIG. 6, to improve bondability to the substrate 3. In this case, on the reverses 4a and 5a of the cover sheets 4 and 5 it is desirable to form unevenness corresponding to #400–#1000 abrasive grain size specified in JIS to enhance bondability by increasing the substantial bonding area with the substrate 3. Further, when direct printing is provided on the surfaces of the cover sheets 4 and 5, the surfaces of the cover sheets 4 and 5 are preferably formed with fine unevenness to increase printability. In this case it is preferable to form, on the surfaces 4a and 5b of the cover sheets 4 and 5, unevenness corresponding to #3000–#10000 abrasive grain size specified in JIS to improve the spread of ink and to enhance printability. As methods for producing such cover sheets, there can be listed a method of embedding a filler having a diameter of 0.1 to several tens of micron (abrasive grain and the like can be used) in the stock sheet of the cover sheet by electrostatic coating, a method of kneading the above-mentioned filler in the cover sheet material, and a method of polishing the surface of the stock sheet with abrasive grains.

These top cover sheet 4 and bottom cover sheet 5 are united to the surface of the substrate 3 in an inseparable body, utilizing the cover sheet material and/or the substrate material, for example, utilizing a resin of a low melting point contained in these. Accordingly, between the top cover sheet 4 and the substrate 3 and between the bottom cover sheet 5 and the substrate 3, as shown in FIG. 1, there are formed mixed layers, 4B and 5B, of the cover sheet material and the substrate.

In the above embodiments, only the IC chip 1 and the coil 2 are embedded in the substrate 3, but they are not intended in any way to limit the gist of the present invention, and there may be mounted other parts such as IC modules, resistors, solar cells, liquid crystal display devices, image displays, optical recording media, magneto-optical recording media, tags for preventing shoplifting, etc.

Figure 7:
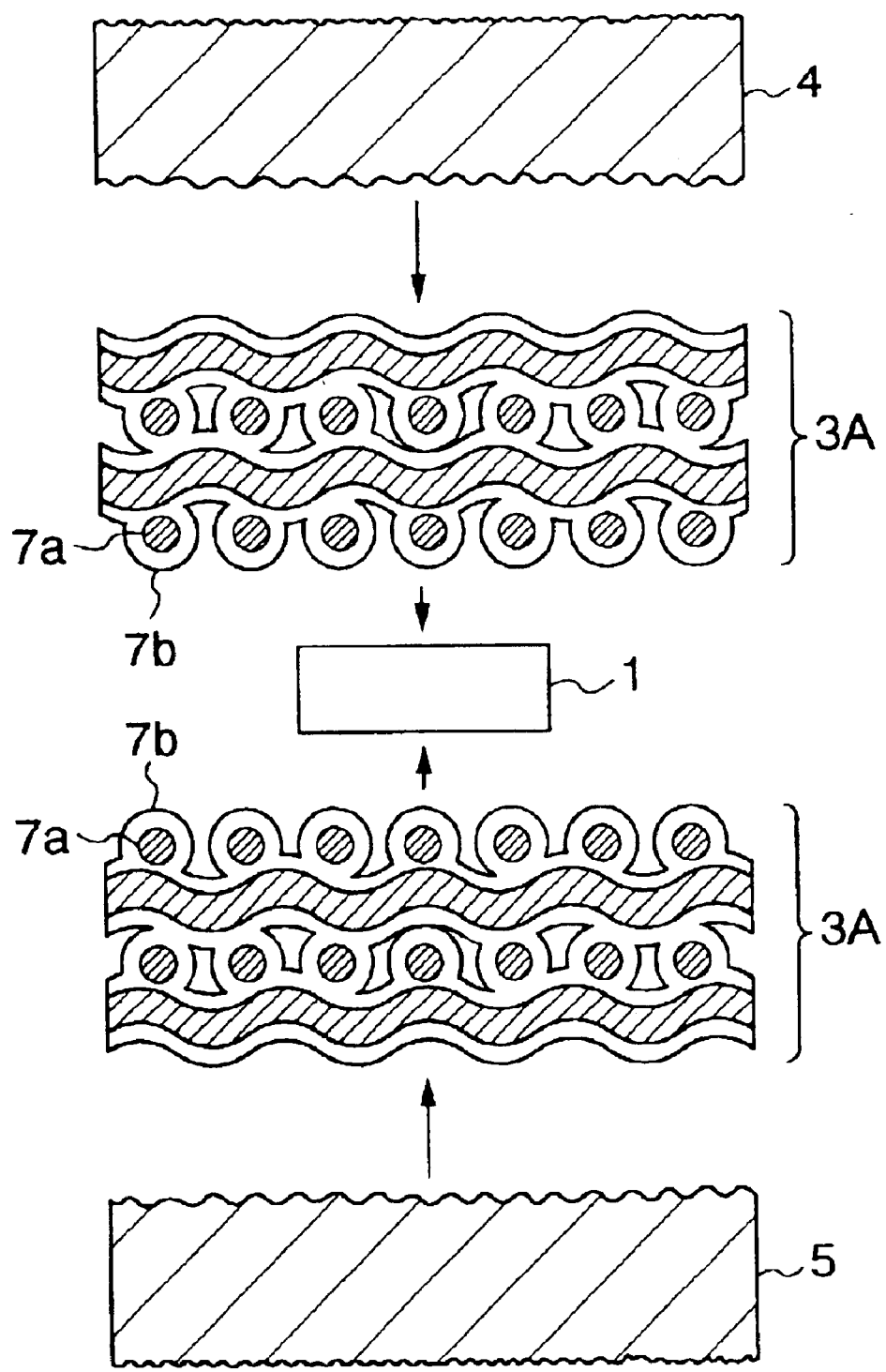
FIG. 7 is a cross-sectional view illustrating the principal part of a first example of process for producing the information carrier.
Figure 8:
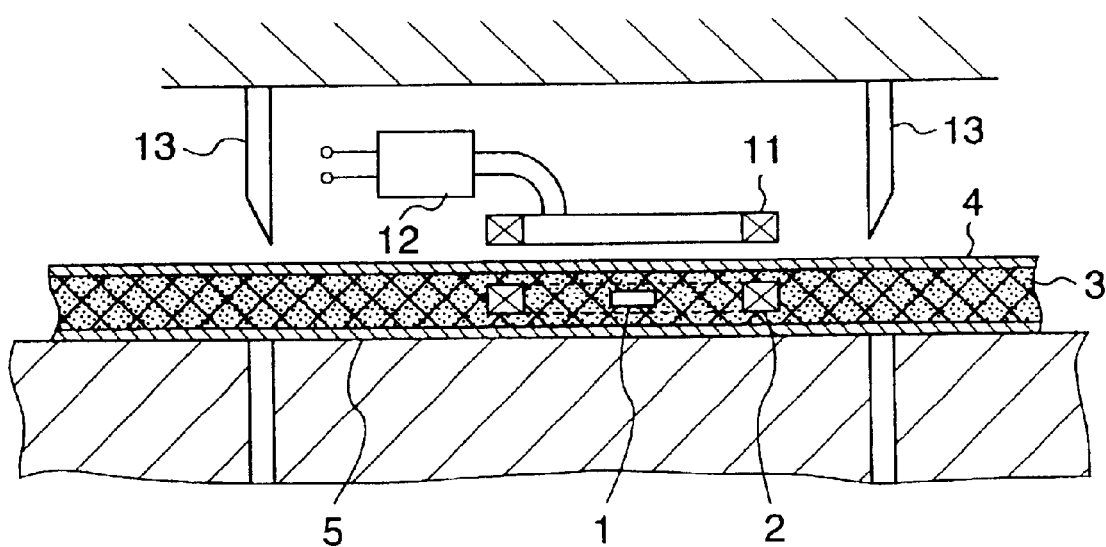
FIG. 8 is a cross-sectional view showing positioning of a coil.
Figure 9:
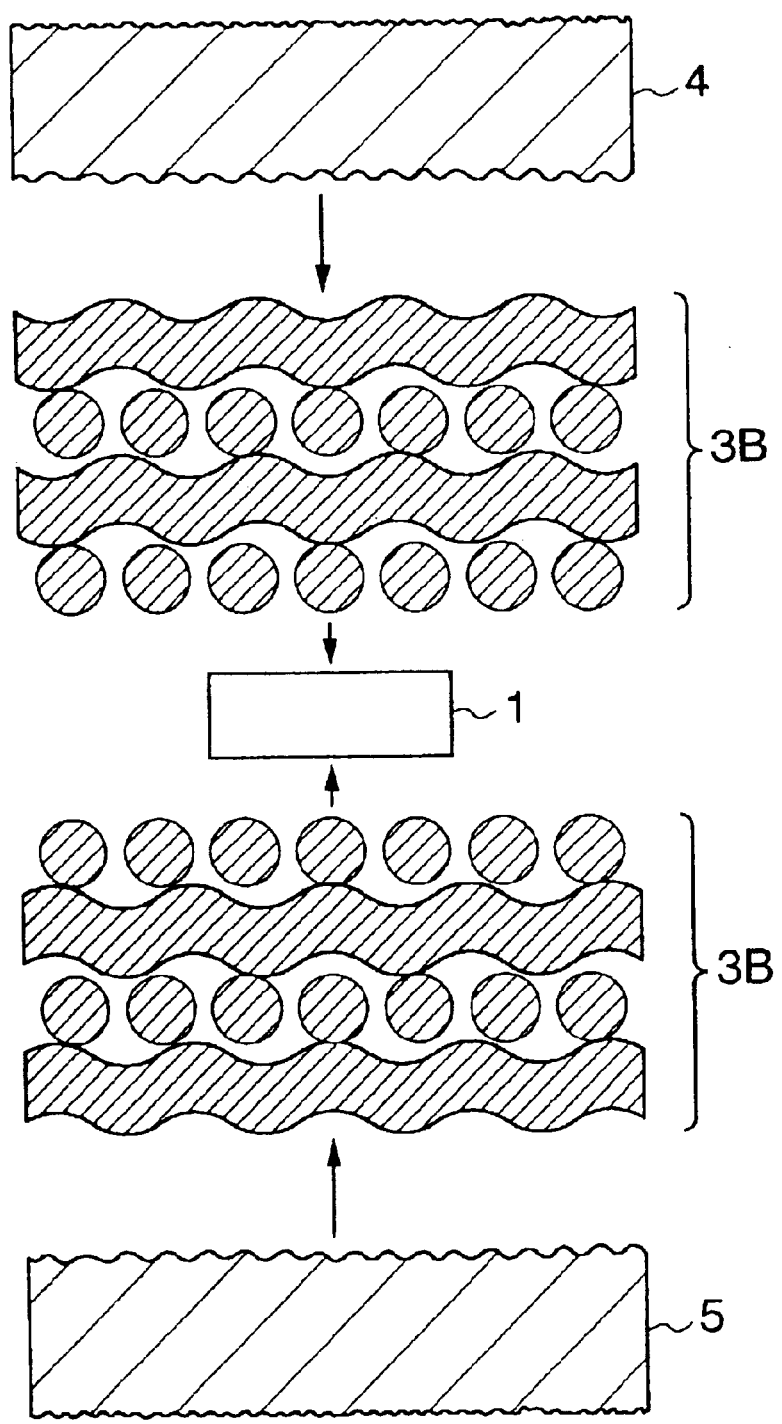
FIG. 9 is a cross-sectional view illustrating a second example of a process for producing the information carrier.
Figure 10A:
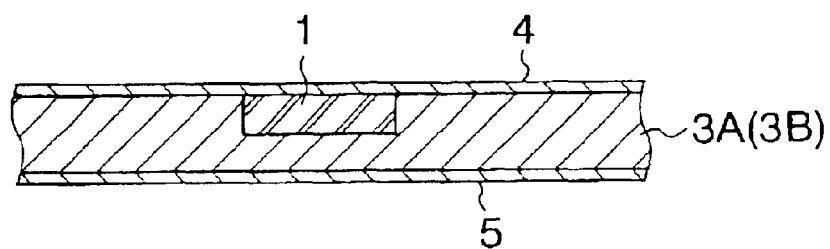
FIGS. 10A and 10B are cross-sectional views of another information carrier having a different lamination structure of a substrate.
Figure 10B:
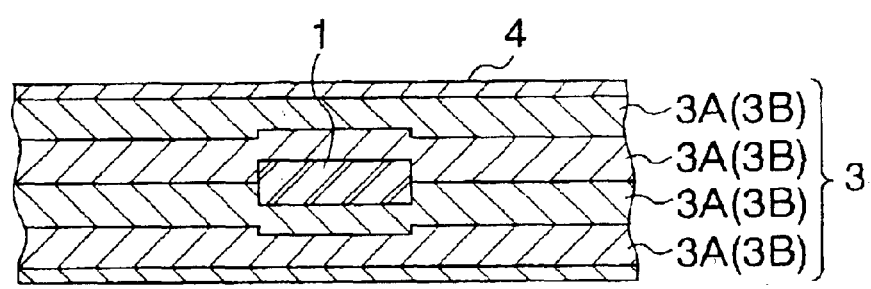
Figure 11:
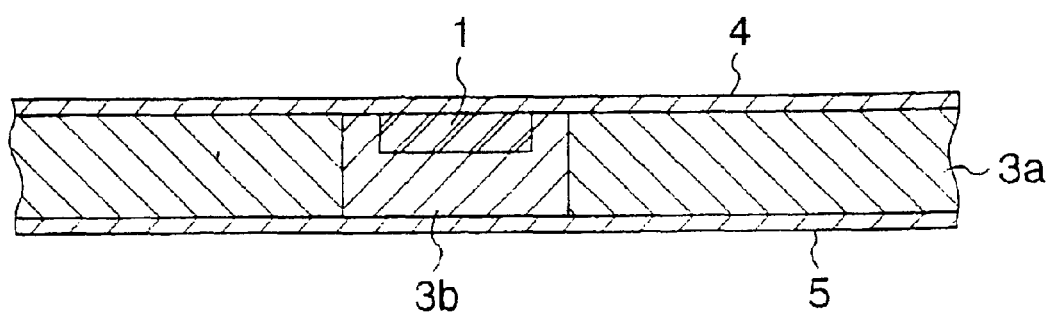
FIG. 11 is a cross-sectional view of an information carrier comprising a substrate which is partially reinforced.
Figure 12:
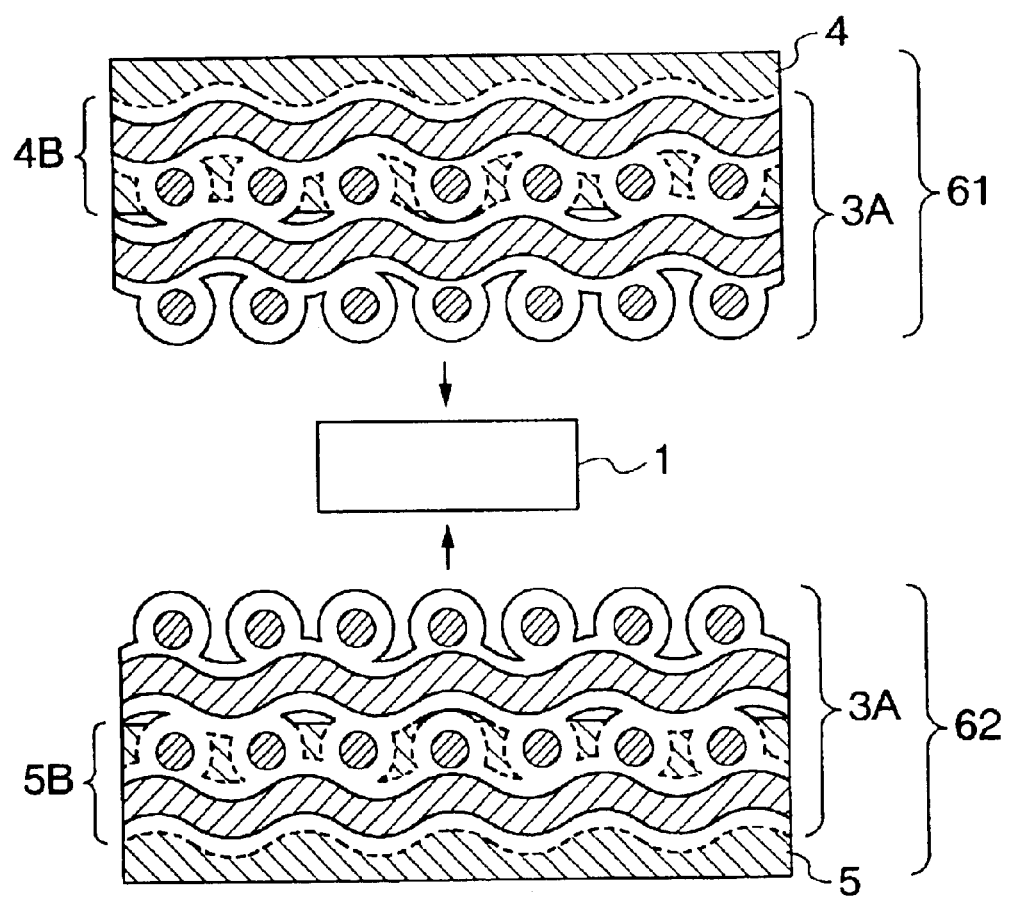
FIG. 12 is a cross-sectional view illustrating the principal part of a third example of a process for producing the information carrier.
Figure 13:
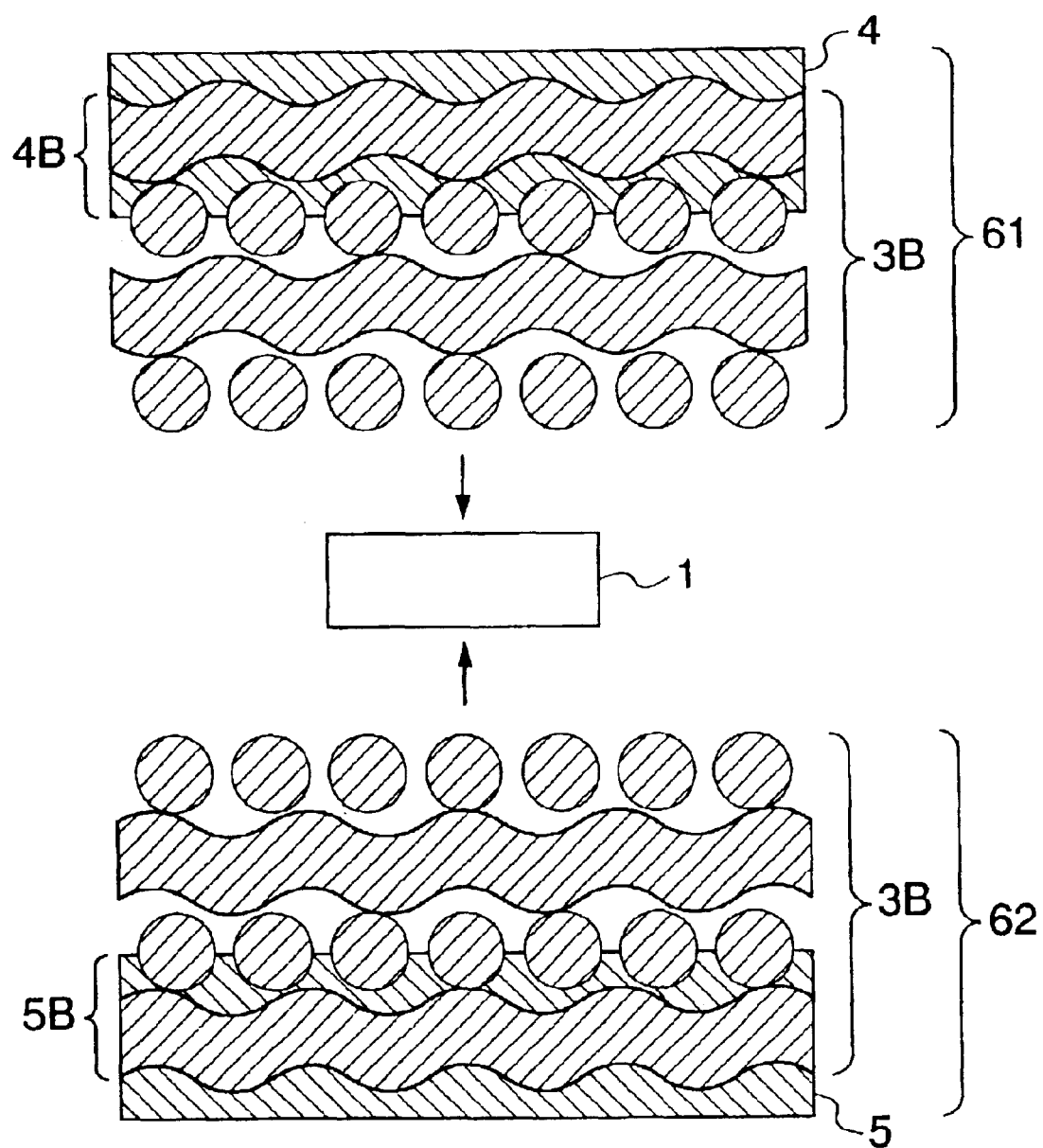
FIG. 13 shows cross-sectional views illustrating the principal part of a fourth example of a process for producing the information carrier.
Figure 14:
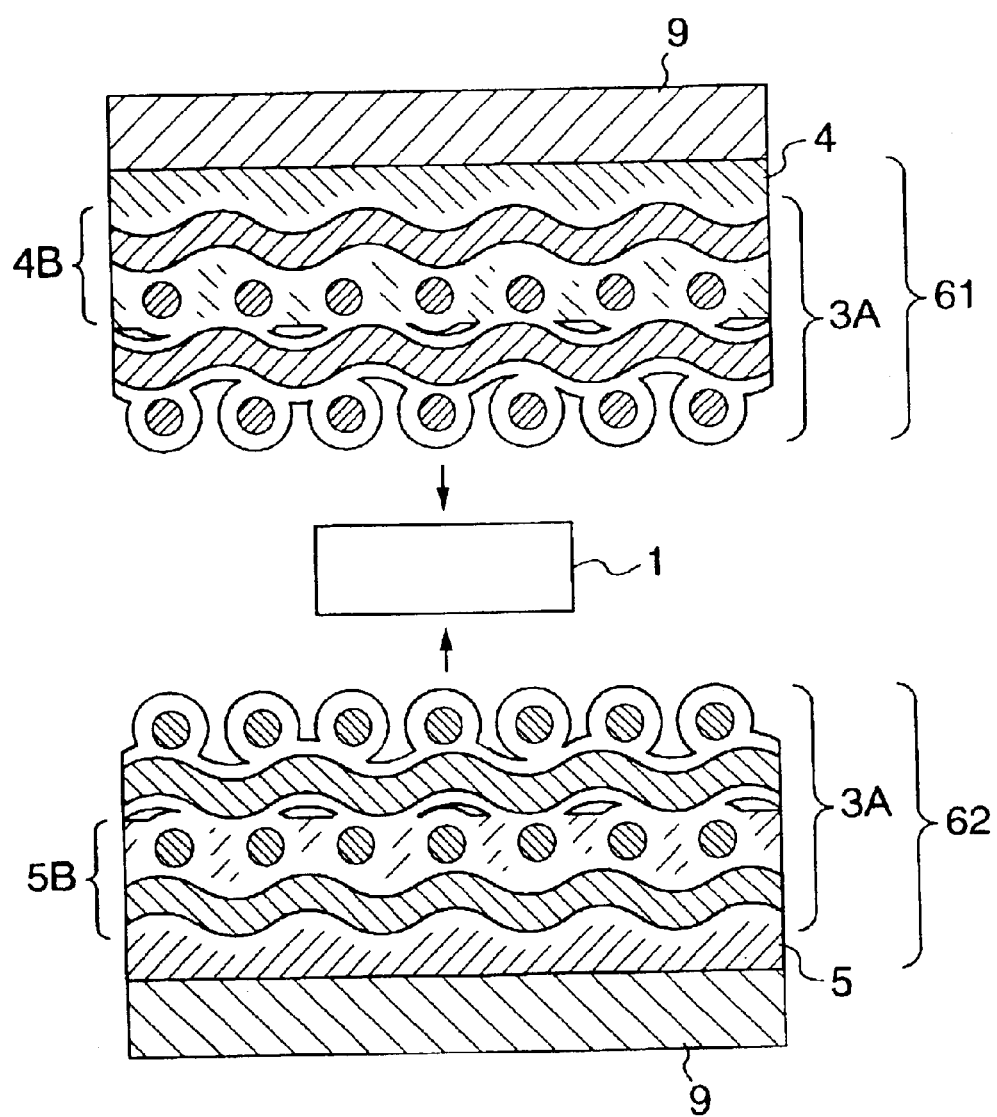
FIG. 14 shows cross-sectional views of an information carrier having an overlay.

The methods for making the information carrier relating to the above embodiments are explained below with reference to FIGS. 7–14. FIG. 7 is a disintegrated cross-sectional view to explain a first example of the manufacturing methods, FIG. 8 is a cross-sectional view showing the positioning of the coil, FIG. 9 is a disintegrated cross-sectional view to explain a second example of the manufacturing methods, FIG. 10 is a cross-sectional view showing another information carrier having a different lamination structure of the substrate, FIG. 11 is a cross-sectional view of an information carrier wherein part of the substrate is reinforced, FIG. 12 is a disintegrated cross-sectional view to explain a third example of the manufacturing methods, FIG. 13 is a disintegrated cross-sectional view to explain a fourth example of the manufacturing methods, and FIG. 14 is a cross-sectional view of an information carrier having an overlay.

<First Example of the Manufacturing Method>

As shown in FIG. 7, the bottom cover 5 is overlaid with the nonwoven fabric 3A having self-bondability, i.e., thermocompression bondability as itself. Then, the IC chip 1 and the coil 2 connected thereto is mounted on the nonwoven fabric 3A after positioning. The nonwoven fabric 3A mounted with the IC chip 1 and the coil 2 is overlaid with the nonwoven fabric 3A of the same kind. Further, the cover sheet 4 is overlapped on the nonwoven fabric 3A which has been overlaid on the IC chip 1 and the coil 2.

A thickness-wise compression force is applied under heating to this lamination, each material is thermocompression bonded utilizing a low melting point resin contained in the nonwoven fabric 3A, and at the same time the IC chip 1 and the coil 2 are embedded in the nonwoven fabric 3A. FIG. 7 shows, as the nonwoven fabric 3A having thermocompression bondability as itself, such one consisting of fibers which are provided with the coating 7b consisting of a low melting point PET on the circumference of the core material 7a consisting of a high melting point PET. In this case, through the coating 7b of PET having a low melting point, there are conducted thermocompression bonding between each fiber, bonding of the two nonwoven fabrics 3A and bonding of the cover sheets 4 and 5 and the nonwoven fabric 3A. When the rigidity of the substrate 3 and the bonding force of the cover sheets 4 and 5 are insufficient only with thermocompression bonding of the nonwoven fabric 3A having thermocompression bondability, the rigidity and the bonding force can be improved by impregnating a resin in the substrate 3. Further, when the strength of the IC chip setting portion is insufficient, the strength can be improved by impregnating a resin only around the IC chip setting portion.

Last, by positioning the coil 2 and cutting the thermocompression-bonded lamination an information carrier having a predetermined shape and size is obtained. In this case, as shown in FIG. 8, there can be adopted the following coil positioning method: the substrate 3 having the IC chip 1 and the coil 2 embedded therein is introduced into a cutter equipped with a positioning coil 11 which transmits a power source and/or information signals to the coil 2 embedded in the substrate 3 and with a transmission efficiency measuring device 12 for measuring the transmission efficiency of the power source and/or information signals between the two coils 2 and 11, the transmission efficiency of the power source and/or information signals between the two coils 2 and 11 is measured by the transmission efficiency measuring device 12, the substrate 3 is fixed at a position at which the transmission efficiency is maximum, and a predetermined portion of the substrate 3 is cut with the cutter 13. Since this makes it possible to accurately position the coil 2 to the substrate 3, there can be produced a non-contact information carrier excellent in the transmission efficiency of the power source and/or information signals. Alternatively, there can be adopted a method wherein the positioning mark provided in advance on the substrate 3 is registered to the positioning mark of the cutter.

<Second Example of the Manufacturing Method>

As shown in FIG. 9, on the bottom cover sheet 5, nonwoven fabric 3B is overlapped which has webs formed with natural fiber and a high melting point resin and which does not have thermocompression bondability as itself. Then, to this fabric 3B there is impregnated a bond (not shown in the drawing) such as thermosetting resin, thermoplastic resin, photocuring resin, curingagent-curing resin and the like. On the nonwoven fabric 3B impregnated with the bond, there are mounted the IC chip 1 and the coil 2 connected to the IC chip 1 after positioning. Further, on the fabric 3B mounted with the IC chip 1 and the coil 2, there is overlaid a nonwoven fabric 3B not having thermocompression bondability as itself. Then, also into the nonwoven fabric 3B overlaid on the IC chip 1 and the coil 2, there is impregnated a bond (not shown in the drawing) of the same kind as the abovementioned one, and then the top cover sheet 4 is overlapped on the nonwoven fabric.

A thickness-wise compression force is applied to this lamination, the bond impregnated in the substrate is treated so as to become cured, each constituting material is united in a body through the bond, and the IC chip 1 and the coil 2 are embedded in the first and second nonwoven fabrics, 3B.

Last, the coil 2 is positioned, and the integrated lamination body is cut to obtain an information carrier of a given shape and size. As the method for positioning the coil at cutting the lamination, a method shown in FIG. 8 can be adopted.

In the manufacturing method of the first and second examples, the two nonwoven fabrics, 3A or 3B, are overlapped across the IC chip 1 and the coil 2. However, for an information carrier requested to be thinner and lower in cost, either of the fabrics 3A or 3B is omitted, as shown in FIG. 10(a). On the contrary, for an information carrier requested to be more durable and reliable, a more increased number of the nonwoven fabrics 3A or 3B can be laid. In this case, the fabrics of the same kind or different kind as well can be used together. In the information carrier manufacturing method of the first and second examples, the inside of the substrate 3 is constructed as to be uniform. However, as shown in FIG. 11, the inside of the substrate 3 can be composed of ununiformly by partly changing the kind of the nonwoven fabric constituting the substrate 3 and by partly changing the resin impregnated thereto. FIG. 11 shows an information carrier enhanced in the damage preventing effect of the IC chip 1 by impregnating around the IC chip setting portion 3b of the substrate 3a resin having higher rigidity after curing than that of the resin impregnated into the other portion 3a.

<Third Example of the Manufacturing Method>

There is produced a first sheet-like material 61 wherein the nonwoven fabric 3A and the cover sheet 4 are united in an inseparable body, as follows: as shown in FIG. 12, on the one side of the nonwoven fabric 3A having thermocompression bondability as itself, for example, one formed with fibers which are provided with the coating 7b consisting of a low melting point PET on the circumference of the core material 7a consisting of a high melting point PET, there is coated a melt of the cover sheet material, part of the coated cover sheet material is penetrated into the surface layer of the fabric 3A to form the mixed layer 4B in the interface between the fabric 3A and the cover sheet 4, and then the surface of the cover sheet 4 is flatten with a roller and the like, and the coated cover sheet material is cooled to produce the sheet-like material 61. By a similar method, a second sheet-like material 62 is produced wherein the nonwoven fabric 3A and the cover sheet 5 are united in an inseparable body through the mixed layer 5B.

Next, on the nonwoven fabric 3A of the second sheet-like material 62, the IC chip 1 and the coil 2 connected thereto are mounted after positioning, and then, on the second sheet-like material 62 mounted with the IC chip 1 and the coil 2, the first sheet-like material 61 is overlapped, with the nonwoven fabric 3A turn downward.

A thickness-wise compression force is applied under heating to this lamination, thermocompression bonding between each fiber and bonding of the two overlapped nonwoven fabrics are conducted utilizing a low melting point PET contained in fibers constituting the fabric 3A, and at the same time the embedding of the IC chip 1 and the coil 2 into the nonwoven fabric 3A is conducted. When the rigidity of the substrate 3 and the bonding force of the cover sheets 4,5 are insufficient only with thermocompression bonding of the nonwoven fabric 3A which possesses thermocompression bondability, the rigidity and bonding force can be improved by impregnating a resin into the substrate 3. Further, when the strength of the IC chip setting portion is insufficient, it can be improved by impregnating a resin only around the IC chip setting portion.

Last, the coil is positioned, and the lamination mounted with the nonwoven fabric, cover sheet and fitting is cut to obtain an information carrier of a given shape and size. As a positioning method of the coil at cutting the lamination, a method shown in FIG. 8 can be adopted.

<Fourth Example of the Manufacturing Method>

There is produced a first sheet-like material 61 wherein the nonwoven fabric 3B and the cover sheet 4 are united in an inseparable body, as follows; as shown in FIG. 13, on the one side of the nonwoven fabric 3B not having thermocompression bondability as itself, for example, one having webs formed with natural fiber, synthetic fiber of a high melting point, etc., there is coated a melt of the cover sheet material, part of the coated cover sheet material is penetrated into the surface layer of the fabric 3B to form the mixed layer 4B in the interface between the fabric 3B and the cover sheet 4, and then the surface of the cover sheet 4 is flatten with a roller and the like, and the coated cover sheet material is cooled to produce the sheet-like material 61. By a similar method, a second sheet-like material 62 is produced wherein the nonwoven fabric 3B and the cover sheet 5 are united in an inseparable body through the mixed layer 5B.

Next, on the nonwoven fabric 3B exposing on the one side of the second sheet-like material 62, there is impregnated a bond such as thermosetting resin, thermoplastic resin, photocurable resin and curing agent-curing resin. Then, on the resin impregnated nonwoven fabric 3B, the IC chip 1 and the coil 2 connected to the IC chip 1 are positioned and mounted. Further, on the second sheet-like material 62 mounted with the IC chip 1 and the coil 2, there is overlapped the first sheet-like material 61 made by impregnating into the nonwoven fabric 3B a bond such as thermosetting resin, thermoplastic resin, photocurable resin and curing agent-curable resin, with the nonwoven fabric 3B turn downward.

A thickness-wise compression force is applied to this lamination, the bond impregnated in the substrate is treated so as to become cured, each constituting material is united in a body through the bond, and the IC chip 1 and the coil 2 are embedded in the first and second nonwoven fabrics, 3B.

Last, the coil 2 is positioned, and the lamination of the sheet-like material and the fitting is cut to obtain an information carrier of a given shape and size. As a method for positioning the coil 2 at cutting the lamination, the method shown in FIG. 8 can be adopted.

In the information carrier manufacturing method of the third and fourth examples, to facilitate the explanation, the first and second sheet-like materials, 61 and 62, are used, but it is possible to laminate sheet materials having the same structure.

In the information carrier manufacturing method of the third and fourth examples, two sheet-like materials are laminated. However, for an information carrier requested to be thinner and lower in cost, either of the sheet-like materials can be omitted. In this case, it is preferable to paste the cover sheet on the surface not having the sheet-like material.

In the information carrier manufacturing method of the third and fourth examples, the top cover sheet 4 and the bottom cover sheet 5 are formed by coating the cover sheet material on the one side of the nonwoven fabric 3A and 3B. This method, however, forms only a cover sheet having a small film thickness. Accordingly, when providing a cover sheet larger in film thickness is necessary, as shown in FIG. 14, an overlay can be provided on the surface of the top cover sheet 4 and the bottom cover sheet 5 formed by coating the cover sheet material. In this case, the overlay 9 can be formed with a resin material same as or different from the cover sheet material, and can be bonded to the surface of the top cover sheet 4 and the bottom cover sheet 5 utilizing the cover sheet material coated on the nonwoven fabric 3A and 3B, and moreover can be adhered to the surface of the top cover sheet 4 and the bottom cover sheet 5 through an adhesive.

Figure 15:
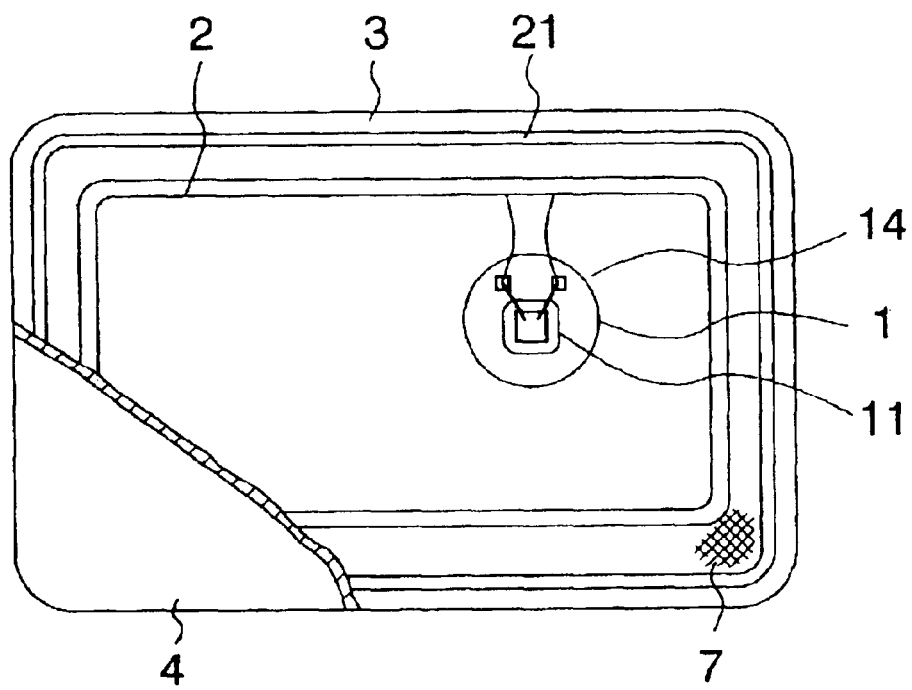
FIG. 15 is a partially sectioned plan view of an information carrier according to the second embodiment.
Figure 16:
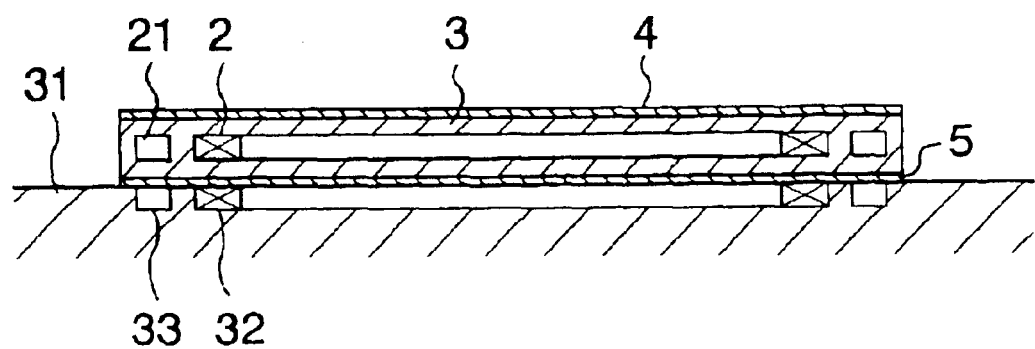
FIG. 16 is a cross-sectional view illustrating the use of the information carrier according to the second embodiment.

The second example of the information carrier of the present invention is explained with reference to FIGS. 15–16. FIG. 15 is a plan view of the information carrier of the example, and FIG. 16 is a cross-sectional view in the state of use.

As is clear from these drawings, this example of the information carrier is characterized in that on a substrate 3, there is mounted a magnetism-positioning means 21 for accurately opposing a coil 2 mounted on the substrate 3 to a coil 32 provided in an external equipment 31. When a magnet is provided in the external equipment 31 as a carrier-positioning means 33, a ferromagnetic is mounted on the substrate 3 as the magnetism-positioning means 21. When a ferromagnetic is mounted on the external equipment 31 as the carrier-positioning means 33, a magnet is mounted on the substrate 3 as the magnetism-positioning means 21.

In FIG. 15, the magnetism-positioning means 21 has a frame shape and is located along the periphery of the substrate 3, but the shape and location of the magnetism-positioning means 21 are not limited thereto and the magnetism-positioning means in any shape may be mounted on the substrate 3 in any configuration. The information carrier of the example can be produced by also mounting the magnetism-positioning means 21 at the time of mounting the IC chip 1 and the coil 2 on a nonwoven fabric which constitutes the substrate 3. Since other portions thereof are the same as those of the information carrier according to the above-mentioned embodiments, explanation of the other portions is omitted for avoiding duplication.

The information carrier of the present example has the same effects as those of the information carrier according to the above-mentioned first example. Furthermore, because of the mounting of the magnetism-positioning means 21 as a magnet or ferromagnetic on the substrate 3, when, as shown in FIG. 16, the information carrier is fitted to the external equipment 31 equipped with the carrier-positioning means 33 having a mutual magnetic attraction between the carrier-positioning means 33 and the magnetism-positioning means 21, the coil 2 mounted on the substrate 3 and the coil 32 provided in the external equipment 31 are opposed to each other automatically and very precisely, so that the receipt efficiency of electric power and the accuracy of giving and receiving of signals are improved.

Figure 17:
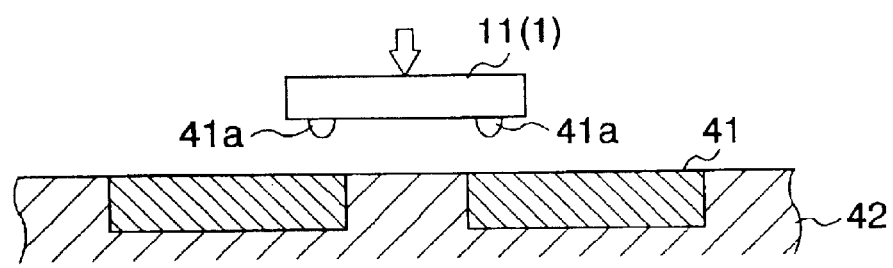
FIG. 17 is a cross-sectioned view of principal parts of the information carrier according to the third embodiment.
Figure 18:
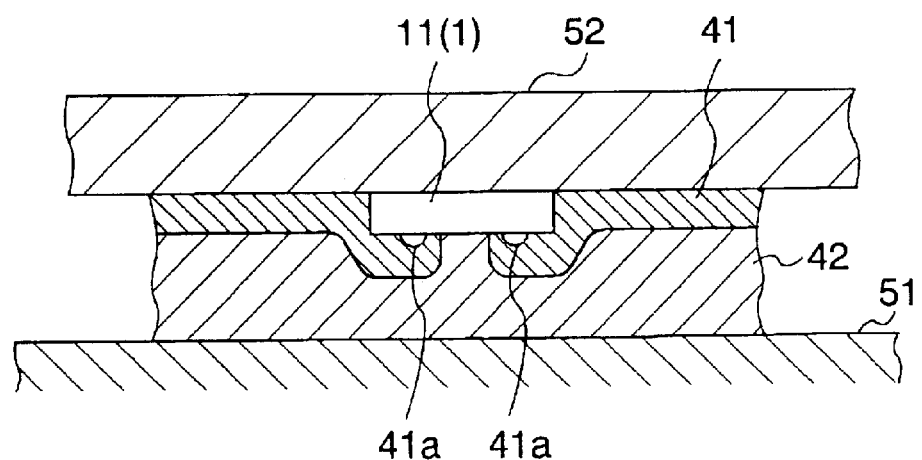
FIG. 18 illustrates a process for producing the information carrier according to the third embodiment.

A third example of the information carrier of the present invention is explained below with reference to FIGS. 17 and 18. FIG. 17 is a cross-sectional view of the principal part of the information carrier of this example, and FIG. 18 is a chart illustrating a process for producing the information carrier of this example.

As is clear from FIG. 17, the information carrier of this example is characterized in that a circuit pattern 41 is directly formed on the substrate 3 and that an electronic part 11a is connected to the circuit pattern 41 as a fitting. The circuit pattern 41 can be produced, for example, by pattern printing and can be incorporated with a coil used as a means for non-contact transmission of data and/or a power source. Such bumps 41a as shown in the Figure may be formed on the joint of the electronic part 11a. The circuit pattern 41 can be connected to the electronic part such as an IC chip as follows: as shown FIG. 18, the nonwoven fabric 42 having the necessary circuit pattern 41 formed thereon is placed on a surface plate 51 with the circuit pattern 41 side upward, and the IC chip 1 is mounted at a predetermined position on the circuit pattern 41 with positioning, after which a press plate 52 is pressed on the top surface of the IC chip 1 to hot-press the nonwoven fabric 42 in the direction of the thickness. Since other portions of the information carrier of the present example are the same as those of the information carrier according to the above-mentioned embodiments, explanation of the other portions is omitted for avoiding duplication. If necessary, the following is also possible: the IC chip 1 is mounted on the circuit pattern 41 of the nonwoven fabric 42 placed on the surface plate 51, after which a nonwoven fabric having no circuit pattern 41 is placed on the nonwoven fabric 42 from above the IC chip 1, and the two nonwoven fabrics are hot pressed in the direction of the thickness.

The information carrier of this example has the same effects as those of the information carrier according to the above-mentioned first embodiment. Furthermore, since the circuit pattern 41 is directly formed on the substrate 3 and the electronic part is connected to the circuit 41 as a fitting, the number of parts can be reduced as compared with the case where a separately formed IC module, insulated substrate or the like is mounted on a reinforcer. Therefore, the production cost of the information carrier can be reduced.

Figure 19:
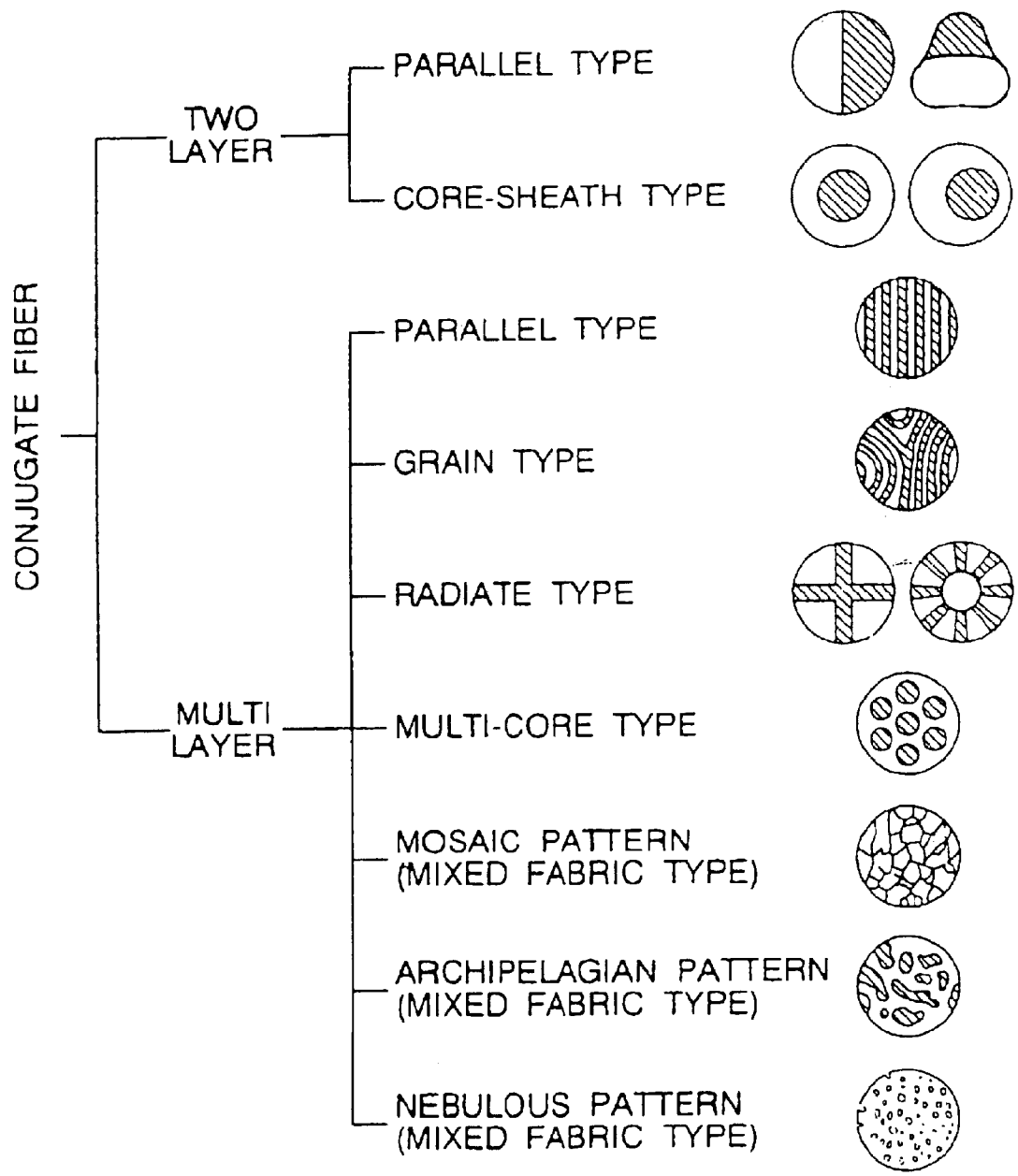
FIG. 19 is a cross-sectioned view of a conjugated fiber.
Figure 20:
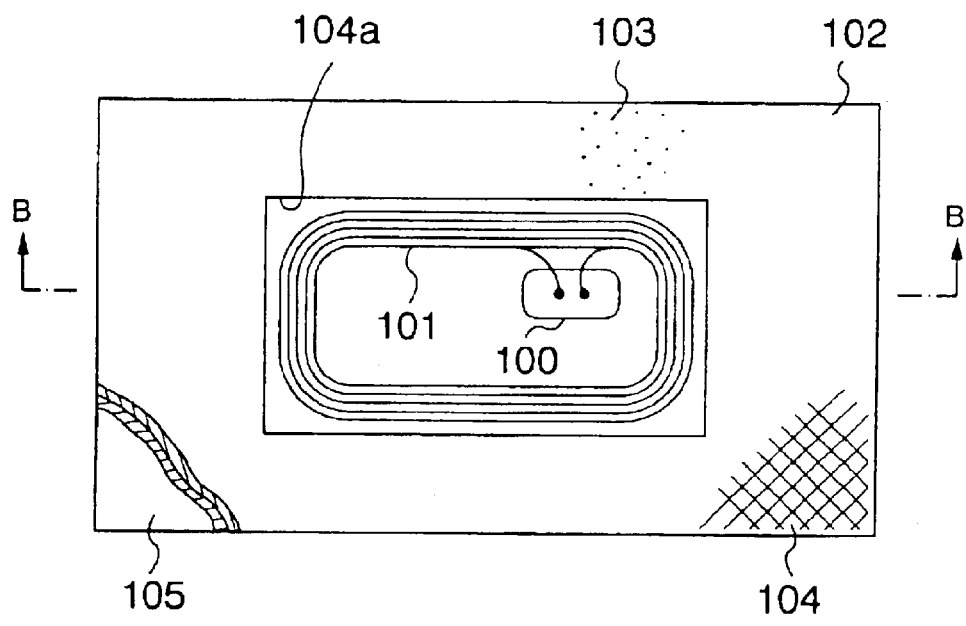
FIG. 20 is a partially sectioned plan view of a conventional information carrier.
Figure 21:
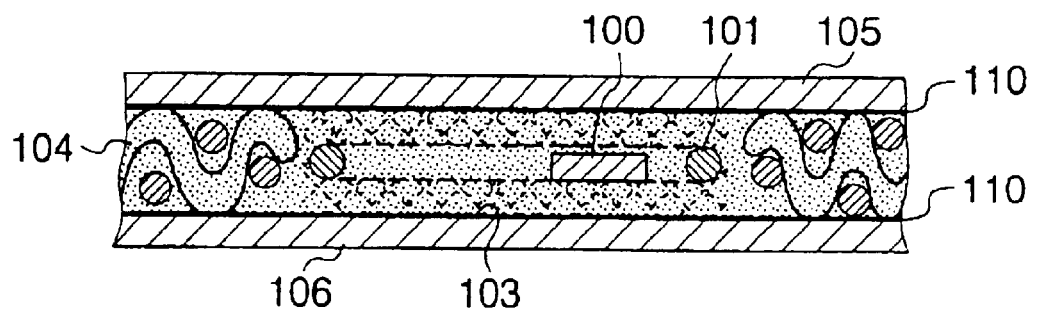
FIG. 21 is a cross-sectional view taken along the line II—II of FIG. 20.
Figure 22:
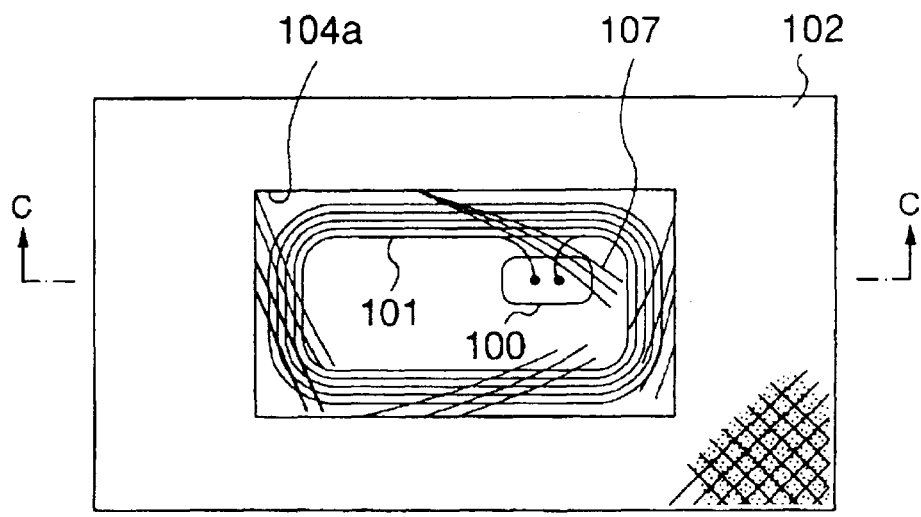
FIG. 22 is partially sectioned plan view of an information carrier for explaining the disadvantage of prior art.
Figure 23:
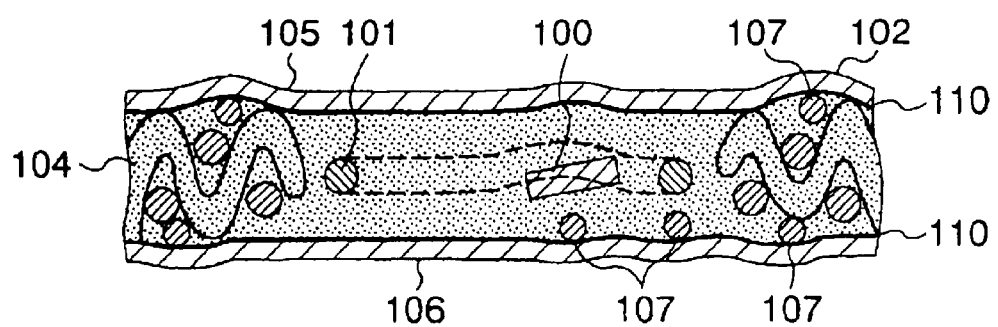
FIG. 23 is a cross-sectional view taken along the line III—III of FIG. 22.

The present invention is characterized by using as the substrate a facial material having compressibility or deformability in the direction of thickness and by embedding fitting(s) inside the substrate utilizing compressibility or deformability of the facial material. The shapes, structures, dimensions, production processes, etc. of the materials constituting the information carrier are not limited by the above-mentioned embodiments. Other embodiments of the present invention are described below.

i) Although a nonwoven fabric is used as a material for the substrate 3 in the above-mentioned embodiments, there can be used, besides nonwoven fabrics, woven fabric, knitted fabrics, paper and skin as long as they have thickness-wise compressibility or deformability, and also there can be used a synthetic resin sheet provided with thickness-wise deformability and compression-bondability with other materials by chemical treatment such as solvent coating or physical treatment such as heating. As the thermocompression-bondable woven fabrics and knitted fabrics, there can be exemplified those obtained by mixed fiber spinning with low-melting binder fiber and those obtained by using conjugate fiber having in a section two or more portions different in melting point as stock fiber which constitutes the woven fabric or knitted fabric. Needless to say, the conjugate fiber may be used as the aforesaid binder fiber. FIG. 19 shows the section structures of various conventional conjugate fibers. In FIG. 19, the hatched area indicates a high-melting portion, and the blank area a low-melting portion. When a woven or knitted fabric obtained by mixed fiber spinning using low-melting binder is hot-pressed, the whole or a portion of the binder fiber is melted to fuse with high-melting fiber, and hence the substrate 3 can be formed as a thermocompression-bonded product. When the conjugate fiber is used as stock fiber for woven fabric or knitted fabric, the low-melting portions of the conjugate fiber are melted together by hot-pressing, so that the substrate 3 can be formed as a thermocompression-bonded product also in this case.

ii) In the above-mentioned embodiments, there are explained the information carrier and the manufacturing method thereof, wherein fitting(s) is completely embedded in the main body constituted by the substrate 3 and the cover sheets 4,5. However, there can be obtained such information carrier that part of the fitting is exposed from the main body, by devising the lamination structure of the substrate 3 and the cover sheets 4,5, and shapes of the cover sheets 4,5. By applying this it becomes possible to make a contact type information carrier in which electrode terminals for transmitting data and/or power are exposed on the surface of the substrate 3.

iii) The IC chip 1 and the coil 2 are exemplified as fittings for the substrate 3 in the above-mentioned embodiments, but in place of or together with them, there may be mounted any means for non-contact transmission other than IC chip and coil, capacitors, resistors, solar cells, liquid crystal display devices, optical recording media, magneto-optical recording media, etc.

iv) In the above-mentioned embodiments, the bonding between the substrate 3 and the cover sheets 4,5 are done using part of the substrate material and the cover sheet material, and the bonding between the cover sheet 4,5 and the overlay is conducted using part of the cover sheet material. These bonding, however, can be conducted through an adhesive which has been prepared separately.

v) In the above-mentioned embodiments, the card-like information carriers are exemplified in the drawings, but they are not intended in any way to limit the gist of the present invention, and the present invention can be applied to the production of an information carrier of any shape such as coin shape.

As explained above, the structure of the information carrier according to the present invention is that fitting(s) is embedded in a substrate composed of a compressed body or deformed body of a facial material having thickness-wise compressibility or deformability. Hence, no cut-out holes need be made in the nonwoven fabric or woven fabric which constitutes the substrate, and, since stress is not concentrated in a part of the substrate even when it receives an irregular external force such as flexure, the strength and durability of the information carrier can be improved. Furthermore, since no cut-out hole is made in the substrate, no such phenomena arise that fibers frayed and stuck out of a cut surface overlap with the fitting(s) or extend to above or below the substrate. Since this enables the obverse and reverse of the substrate to be formed flat, the appearance of the information carrier can be made beautiful, and, when the information carrier is such that, for example, a photograph of owner's face is printed on the surface of the substrate or the surface of a cover sheet attached to the surface of the substrate, the photograph of the face or the like can be clearly printed.

The information carrier obtained by forming cover sheets on the right side and reverse side, respectively, of the substrate without a bonding layer has not only the above effects but also the following effects: the information carrier can be thinned; its production cost can be reduced; peeling between the substrate and the cover sheets is prevented, so that the durability of the information carrier can be increased; and since the casing of the information carrier can be facilitated as compared with the case where cover sheets are adhered to the surfaces of the substrate through bonding layers, the information carrier having a good surface appearance can be produced in high yield.

Further, the information carrier which uses, as the substrate material and cover sheet material, materials not emitting toxic substances such as chlorine gas on combustion, i.e., materials such as PET and PEN, can contribute to the protection of earth environment. The PET and PEN are poorer in printability and bondability with other materials than polyvinylchloride, but if a necessary printing is provided on the reverse of the substrate or cover sheet, the abrasion of the printed surface can be prevented, and thus the poorness in printability can be avoided practically. Further, if a mixed layer of the substrate material and the cover sheet material is formed, the substrate and the cover sheet are stuck into an inseparable body, and the poorness in bondability is practically avoided.

On the other hand, as to the process for producing the information carrier, a necessary fitting is set on a woven fabric or the like which constitutes a substrate, and then they are hot-pressed in the direction of the thickness, whereby the substrate is formed and the fitting(s) is embedded in the substrate. Therefore, the production of the information carrier is simplified, so that its production cost can be reduced. Particularly when various information carriers different in the kind and size of a fitting(s), it is not necessary to prepare different woven fabrics or the like, depending on the kind and size of the fitting(s). Therefore, the productivity of the various information carriers is greatly improved, so that their production cost can be markedly reduced.

Furthermore, as a method for positioning of a coil, the following method is adopted: the transmission of a power source and/or information signals is made between the coil embedded in the substrate and a coil provided in a cutter, and the substrate is fixed at a position at which the transmission efficiency is maximum, after which a predetermined portion of the substrate is cut out. Therefore, the position of setting the coil in relation to the substrate can be accurately controlled, so that there can be produced a non-contact information carrier excellent in the transmission efficiency of a power source and/or information signals.

What is claimed is:

1. A method for manufacturing a contact-less information recording carrier comprising the steps of:

overlapping, on a first cover sheet, a first material which comprises synthetic resin fiber and has a first portion (A) and a second portion (B) wherein the first portion (A) has a lower melting point than the second portion (B), mounting, on the first material, an IC chip and a coil electrically connected to the IC chip, the coil being means for contact-less transmitting data and/or electric power, overlapping, on the first material on which the IC chip and the coil have been mounted, a second material which comprises synthetic resin fiber and has a first portion (A') and a second portion (B'), overlapping a second cover sheet on the second material to obtain a lamination, and applying a thickness-wise compression force under heat to the lamination.

2. A method according to claim 1, further comprising a step of cutting the lamination to attain a predetermined shape and size.

3. A method for manufacturing a contact-less information recording carrier comprising the steps of:

overlapping, on a first cover sheet, a first material which comprises synthetic resin fiber and has a first portion (A) and a second portion (B) wherein the first portion (A) has a lower melting point than the second portion (B), mounting, on the first material, an IC chip and a coil electrically connected to the IC chip, the coil being means for contact-less transmitting data and/or electric power, overlapping, on the first material on which the IC chip and the coil have been mounted, a second material which comprises synthetic resin fiber and has a first portion (A') and a second portion (B') wherein the first portion (A') has a lower melting point than the second portion (B'), overlapping a second cover sheet on the second material to obtain a lamination, and applying a thickness-wise compression force under heat to the lamination; and wherein each of the first material and the second material comprises synthetic resin fibers which are provided with a coating on the circumference of a core material wherein the coating has a lower melting point than the core material.

4. A method according to claim 3, further comprising a step of cutting the lamination to attain a predetermined shape and size.

5. A method for manufacturing a contact-less information recording carrier comprising the steps of:

overlapping, on a first cover sheet, a first material which comprises synthetic resin fiber and is a mixture of a first portion (A) and a second portion (B) wherein the first portion (A) has a lower melting point than the second portion (B), mounting, on the first material, an IC chip and a coil electrically connected to the IC chip, the coil being means for contact-less transmitting data and/or electric power, overlapping, on the first material on which the IC chip and the coil have been mounted, a second material which comprises synthetic resin fiber and is a mixture of a first portion (A') and a second portion (B') wherein the first portion (A') has a lower melting point than the second portion (B'), overlapping a second cover sheet on the second material to obtain a lamination, and applying a thickness-wise compression force under heat to the lamination.

6. A method according to claim 5, further comprising a step of cutting the lamination to attain a predetermined shape and size.

* * * * *